United States Patent [19]
Berger et al.
[11] 3,823,353
[45] July 9, 1974

[54] MULTI LAYERED VERTICAL TRANSISTOR HAVING REACH-THROUGH ISOLATING CONTACTS

[75] Inventors: Horst H. Berger, Sindelfingen; Siegfried K. Wiedmann, Stuttgart, both of Germany

[73] Assignee: International Business Machines Corporation, Armonk, N.Y.

[22] Filed: Mar. 2, 1973

[21] Appl. No.: 337,510

[30] Foreign Application Priority Data
Mar. 14, 1972 Germany .......................... 22121682

[52] U.S. Cl. ....................357/40, 307/215, 357/48, 357/51, 357/89
[51] Int. Cl. .......................... H01l 11/00, H01l 15/00
[58] Field of Search ............ 317/235, 22.1, 31, 482, 317/48.4; 307/215

[56] References Cited
UNITED STATES PATENTS

| | | | |
|---|---|---|---|
| 3,506,893 | 4/1970 | Dhaka | 317/235 E |
| 3,524,113 | 8/1970 | Agusta et al. | 317/235 E |
| 3,576,682 | 4/1971 | Frouin et al. | 317/235 E |
| 3,622,382 | 11/1971 | Karl | 317/235 E |
| 3,643,235 | 2/1972 | Berger et al. | 317/235 E |
| 3,697,337 | 10/1972 | Stehlin | 317/235 E |
| 3,717,564 | 2/1973 | Bhatt | 317/235 E |
| 3,736,477 | 5/1973 | Berger et al. | 317/235 R |

*Primary Examiner*—Andrew J. James
*Attorney, Agent, or Firm*—Martin G. Reiffin

[57] ABSTRACT

Logic circuits for performing the INVERTER and NOR functions, and monolithic integrated structures for realizing the circuits. The basic circuit comprises PNP transistor and an NPN transistor. The emitter of the PNP transistor has its base grounded and its collector connected to the base of the NPN transistor having its emitter grounded. The logic signal input is at the base of the NPN transistor. The output is taken at the collector of the NPN transistor and is the inverse of the input. Two such basic circuits are interconnected to provide the NOR function.

6 Claims, 8 Drawing Figures

MULTI LAYERED VERTICAL TRANSISTOR HAVING REACH-THROUGH ISOLATING CONTACTS

CROSS-REFERENCE TO RELATED APPLICATION

In our prior pending application Ser. No. 134,008 filed Apr. 14, 1971, now U.S. Pat. No. 3,736,477 issued May 29, 1973, and entitled "Monolithic Semiconductor Circuit For a Logic Concept of High Packing Density" there is disclosed a semiconductor device structure for realizing the basic two-transistor logic circuit forming a part of the present invention.

BACKGROUND OF THE INVENTION

1. Field of the Invention

This invention relates to a monolithic integrated semiconductor structure consisting of partial structures with at least one transistor.

2. Description of the Prior Art

Bipolar monolithic technology is being employed for producing structures whose dimensions and doping profiles are essentially governed by one semiconductor chip surface. The methods used for this purpose are generally known under the term planar diffusion technology, whereby the various elements are arranged on a common semiconductor chip, being contacted with each other by means of conductor patterns. Relatively low-doped silicon is used as a substrate on which a thin low-doped monocrystalline silicon layer is epitaxially grown. In successive photolithographic steps followed by diffusion steps structures forming PN-junctions are introduced into this epitaxially grown silicon layer. As the epitaxial layer has a relatively high conductivity, the interconnected circuit elements arranged on a common semiconductor chip have to be isolated against each other. The isolation method currently employed consists in isolation pockets being formed by separate semiconductor regions, accommodating the individual circuit elements, being generated by means of additional frame-shaped diffusion zones which constitute backward-biased PN-junctions. The active semiconductor zones of a transistor which are embedded in each other must have a certain minimum surface for contacting. Apart from this, the frame-shaped isolation zones surrounding the active zones and which must penetrate the epitaxial layer down to the substrate entail additional area requirements because of their lateral outdiffusion. That means that the dimensions and the doping profiles generated by diffusion lead to such structures not being optimal where circuits with extremely high densities and minimum dissipation rates are to be produced. Further disadvantages consist in the charge storage of the transistors in the saturated state being difficult to control and in relatively many masking and diffusion steps being required.

For reasons of cost and reliability it is desirable that the number of circuit components to be accommodated on a single chip be as great as possible. It is equally desirable that the steps required for designing monolithic semiconductor circuits be simplified, improved, or reduced further. In order to accommodate a greater number of circuit components on a single chip its surface has to be increased as a rule. This has the disadvantage, however, that the number of chips obtainable from a circular wafer decreases. In addition, the chip yield from a wafer drops rapidly. For producing a given circuit having as high a yield as possible the layout must be such that the area requirements are reduced to a minimum.

To meet these requirements and to reduce the problems as outlined it is known from existing monolithic layout techniques of bipolar circuits to group several circuit components in a single isolation pocket, rather than to arrange each circuit in a separate isolation pocket in accordance with the usual layout technique. To this end similar semiconductor zones, connected to the same potential, are formed jointly. It is also known for NPN and PNP-transistors to be integrated in each other in a four-layer structure. In a circuit thus produced the PNP-transistor integrated together with NPN-transistor acts as an anti-saturation circuit element (Micro-electronic circuits and application, J. M. Carrol, McGraw Hill 1965, p. 76, FIG. 4). However, in this known circuit arrangement the area-consuming isolation diffusion cannot be dispensed with either. Finally, the circuit components realized within the isolation pockets do not simplify or reduce the process steps required.

The German Offenlegungsschrift No. 2,021,824 provides for an improved monolithic layout of the said known circuit with two complementary transistors. According to this Offenlegungsschrift, the known circuit is used as a basic component in a logical semiconductor circuit concept. In order to ensure a high packing density, this concept is such that a semiconductor substrate of a first conductivity type accommodates, spaced therefrom, at least two opposite conductivity regions as emitter and collector zones of a lateral transistor structure. The collector zone of the lateral transistor structure comprises at least one further opposite conductivity zone as a collector zone of an inversely operated vertical transistor structure. To operate this semiconductor structure as a logical basic circuit, a current is injected into the emitter zone of the lateral transistor structure, which controls the current flow serving as an output signal and passing the vertical transistor structure as a function of an input signal applied to its associated collector zone.

This known structure and/or logical basic circuit can be universally employed for different logical switching networks by several such circuits which may be operated as NOR circuits, for example, being combined in a particular manner. It is recognizable that the absence of isolation diffusion regions — the individual basic circuits being integratable without separating zones — and the elimination of diffused resistors result in considerable area savings as compared to existing logical circuits. Apart from this, the production process is simplified, being largely in compliance with that generally employed for producing a single planar transistor. It is equally recognizable that the area requirements are governed by the lateral structure of one of the transistors, whereby the area of the diffusion zones touching the surface must be adequate. In addition, selective diffusion processes are necessary for two transistor zones. Finally, it is pointed out that logical operations and the current supply call for separate wiring.

SUMMARY OF THE INVENTION

It is the object of the invention to provide an integrated semiconductor structure consisting of partial structures with at least one transistor and which differs from known structures in that in respectively ensures a further increase in the integration density and a reduction in the area requirements and the power dissipation while providing an optimal speed/power ratio, and an improvement in the characteristics as well as a considerable simplification of the production method employed. In particular, it is the object of the invention to provide as a partial structure a logical semiconductor concept which in comparison with the known circuit concept can be produced in simpler steps and with a higher packing density, without the advantages inherent in the flexibility of applying it for different logical networks being curtailed.

In accordance with the invention, the solution for an integrated semiconductor structure is characterized in that it comprises a first layer of an opposed second conductivity type which is applied to substrate of a first conductivity type, a second layer of the first conductivity type which is applied to the first layer, and a third layer of the second conductivity type which is applied to the second layer, and that for contacting the individual layers each partial structure is surrounded by frame-shaped zones penetrating the layers arranged on top of them and whose conductivity type corresponds to that of the layer to be contacted. The frame-shaped zones are preferably simultaneously employed as isolation zones.

This semiconductor structure has the advantage of offering a simple layout and of being readily producible with respect to the number and complexity of the process steps required. The active zones of the various partial structures merely consist of a uniform laminar structure of alternating conductivity into which frame-shaped zones are introduced in easy process steps. Via these zones the individual partial structures are simultaneously contacted and separated from each other. Such a layout results in extremely high packing densities.

A particularly space-saving layout is characterized in that for defining the partial structures and for contacting the second layer a first zone is provided, whereas for contacting the first layer a second zone is arranged in the first zone. These zones are preferably highly doped. The simplest semiconductor structure is characterized in that within each partial structure the first layer forms the emitter, the second layer the base and the third layer the collector of a first transistor, and that the emitter, the base, and the collector are connected, via contacts, to the surfaces of the second zone, the first zone, and the third layer. Partial structures with single transistors of different emitter potentials are preferably designed in such a manner that the first zone, in the region surrounding the second zone on the outside, extends into the substrate. For forming multi-collector transistors several contacts are arranged on the surface of the third layer. These contacts are preferably designed as Schottky diodes. A transistor structure of this kind has several advantages. The PN-junction capacities are kept low because low doping can be used. Apart from this, the saturation charge of the transistor can be chosen extremely low since inverse current amplification can be reduced to a minimum, so that an internal current amplification effect is eliminated, thus ensuring that only a low charge is stored in the base, and since the collector layer can be extremely thin, so that only a low charge is stored in the collector. This leads to high cut-off speeds.

The advantages described can be obtained in particular when the layers are epitaxial layers and the frame-shaped zones are either diffusion regions or regions produced by ion implantation.

As the first and the third layers consist of a common layer into which the second layer is introduced by ion implantation such a structure is readily producible.

A modification of the semiconductor structure in accordance with the invention is characterized in that the third layer merely consists of a reduced-size collector zone introduced within each partial structure into the second layer, and that with the first zone being eliminated the second layer is contacted directly on its surface outside the collector zone. For the formation of multi-collector transistors several separate collector zones can be introduced into the second zone.

An embodiment consisting of a partial structure with two complementary transistors, whereby the base of the first transistor is connected to the collector of the second transistor and the emitter of the first transistor is connected to the base of the second transistor, is designed in such a manner that the substrate is contacted, serving as emitter of the second transistor whose base and collector consist of the first and the second layer, respectively. The advantages of the latter semiconductor structure are obtained in particular when for operating these partial structures as a logical basic circuit current is made to flow through the emitter of the second transistor controlling the collector current fo the first transistor, which serves as an output signal, as a function of the input signal applied to its collector and to the base of the first transistor, respectively. The thickness and the impurity concentration of the layers are so chosen that the injection of minority charge carriers into the PN-junctions of the transistors, which are forward-biased during operation, is primarily effected in the direction of lamination.

A further embodiment of the semiconductor structure as a logical basic circuit in accordance with the invention is characterized in that for forming a NOR and a NAND-circuit, respectively, at least two such basic circuits are coupled on their outputs to form a joint output. Still a further embodiment is characterized in that the monolithic layout of complex logical networks consists in such basic circuits being strung together.

All of these semiconductor structures have the advantage that the area requirements are greatly reduced, that wiring is made simple, that the input and output capacities are essentially reduced, that they are readily producible, and, in particular, that their cutoff speed is high and that their speed/power ratio is optimal.

BRIEF DESCRIPTION OF THE DRAWINGS

The invention is hereafter described by means of drawings in which

FIG. 5A is a schematic plan view;

FIG. 6A is a schematic plan view, and

DESCRIPTION OF THE PREFERRED EMBODIMENTS

As previously indicated, each partial structure in accordance with the invention can be a single transistor or a combination of several transistors connected in a particular manner. This does not lead to any differences in the actual structure but merely in its contacting. For this reason the invention is initially explained by means of a combination of several semiconductor structures forming a basic circuit for a logical circuit and subsequently by means of a complete logical circuit consisting of such a basic circuit, with the design and operation of a single transistor being readily understandable.

Figure 1:
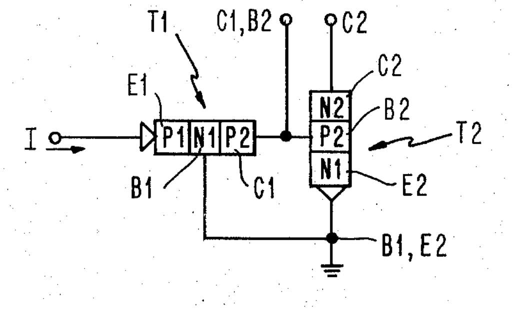
FIG. 1 is an electrical equivalent-circuit diagram of a semiconductor structure in accordance with the invention and which serves as a basic circuit.

The electrical equivalent-circuit diagram of the basic circuit for a logical circuit concept is shown in FIG. 1. The concept consists of two complementary transistors T1 and T2. Collector C1 of the PNP-transisotr T1 is connected to base B2 of the NPN-transistor T2. In addition, base B1 of the transstor T1 is connected to emitter E2 of transistor T2. Via emitter E1 of PNP transistor T1 current I is fed into base B2 of the NPN transistor T2. Collector C2 of the NPN transistor T2 forms the output of the circuit. As is shown in the equivalent-circuit diagram, the two transistors have semiconductor zones which are connected to the same potential. Thus these semiconductor zones are identically referenced and can be accommodated in common zones upon realizing the semiconductor structure. The operation of the basic circuit is as follows. If a defined potential is not applied to the common collector-base terminal C1,B2 current I injected into PNP transistor T1 flows into the base of NPN transistor T2. Thus transistor T2 becomes saturated. If, on the other hand, the common collector-base terminal C1,B2 is connected to ground potential, current I injected into transistor T1 is drawn off via this terminal so that it is prevented from flowing into the base of transistor T2. In this case transistor T2 is cut off. Taking into account the potentials on collector C2 of the transistor T2, an inverter circuit is formed by combining the two transistors T1 and T2.

Figure 2:
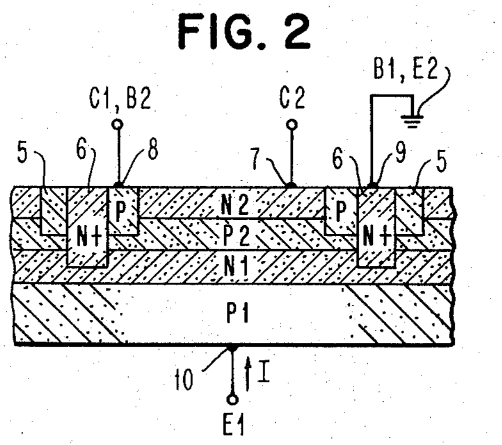
FIG. 2 is a schematic cross-section of the corresponding semiconductor structure in accordance with the invention.

FIG. 2 shows by means of a first embodiment the design of the semiconductor structure forming the basic circuit of FIG. 1, the individual zones and terminals being identically referenced. A number of such basic circuits, a schematic cross-section of which is shown in FIG. 2, are arranged on a common chip. On a P-conductive substrate P1 a first N-conductive layer N1 is arranged covered by a P-conductive layer P2 which in turn is followed by an N-conductive layer N2. Substrate P1 serves as a common emitter E1 of the various PNP transistors T1 on the chip. The common layer N1 above substrate P1 simultaneously forms the base for all PNP transistors T1 and the emitter E2 of the NPN transistors T2. Collectors C1 of the transistors T1 which are identical to the bases B2 of the transistors T2 are embodied by layer P2. The final layer N2 forms the collectors C2 of the transistors T2. Each of these basic circuits is defined by rectangular-shaped annular zones 5 and 6. Collector C1 of transistor T1 and base B2 of transistor T2, respectively, are contacted via the frame-shaped P-zone 5. For this reason zone 5 must extend at least into layer P2. Within the rectangular-shaped annular P-zone 5 the rectangular-shaped annular N+zone 6 is arranged, via which layer N1 is contacted. Layer N1 simultaneously serves as a base B1 of the transistor T1 and as an emitter E2 of the transistor T2. The collectors C1 and the bases B2 of the various basic circuits are isolated from each other by N+ doped zone 6. This zone should preferably extend to substrate P1 to favorably influence the injection from the substrate and must extend at least into layer N1. The individual zones and/or layers are connected via contacts 8, 9 arranged on their surface. Collector C2 of the transistor T2 is connected via a contact 7 on the surface of layer N2 arranged within the rectangular-shaped annular zone 5. By suitably choosing the doping, the thickness, and the profile of the various layers, optimal characteristics can be achieved for transistors T1 and T2. The low-resisitivity zone 6 ensures that layer N1 has a uniform potential. Contact 10 is used to contact substrate P1 and thus to connect emitters E1 for transistors T1.

The method of production of such a structure is very simple. Because of the uniform arrangement of the laminate over the full chip surface, layers N1, P2, and N2, rather than being produced by means of a mask, can be epitaxially grown on substrate P1, for example, by alternately adding suitable dopants. When using ion implantation it is initially sufficient to generate an N-doped epitaxial layer on substrate P1, with the doping decreasing as the thickness increases. By ion implantation layer P2 and thus separated layers N1, N2 can be produced in the N-doped epitaxial layer. The frame-shaped zones 5 and 6 can be produced either by diffusion or by ion implantation through masks. Thus only masking steps are necessary to produce the two frame-shaped zones and the contacts. Circuits of the usual type, such as those using single transistors with different emitter potentials, can be readily realized by means of the structure described. To this end layer N1 is interrupted by P-doped zone 5 in the area surrounding zone 6 on the outside being diffused into substrate P1. This requires but one further masking step. The doping of layer P1 can be arbitrarily low as the junction between layers P1 and N1 is merely backward-biased in this case. Ohmic resistances can be realized in layer N2, for example, and also in other layers.

Figure 3:
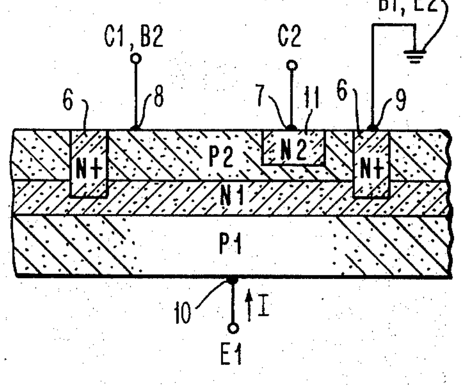
FIG. 3 is a modification of the semiconductor structure in accordance with FIG. 2.

The embodiment of FIG. 3 differs from that of FIG. 2 substantially by the absence of the continuous layer N2 forming the collector C2 of the transistor T2. As layer P2 can thus be contacted immediately on the surface via contact 8, the P-doped zone 5 of the embodiment in FIG. 2 is eliminated. Zone 11 restricted in its size and introduced into layer P2 by diffusion or ion implantation serves as a collector C2. With regard to the typical operation, there is no significant difference between the structures of FIGS. 2 and 3.

Figure 4:
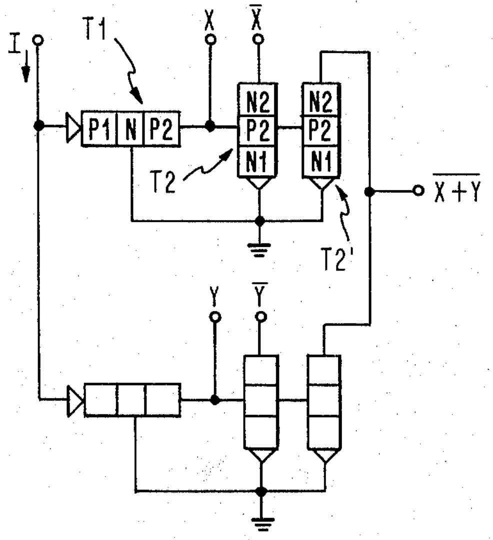
FIG. 4 is an electrical equivalent-circuit diagram of a NOR-circuit realized by means of semiconductor structure in accordance with the invention.
Figure 4:
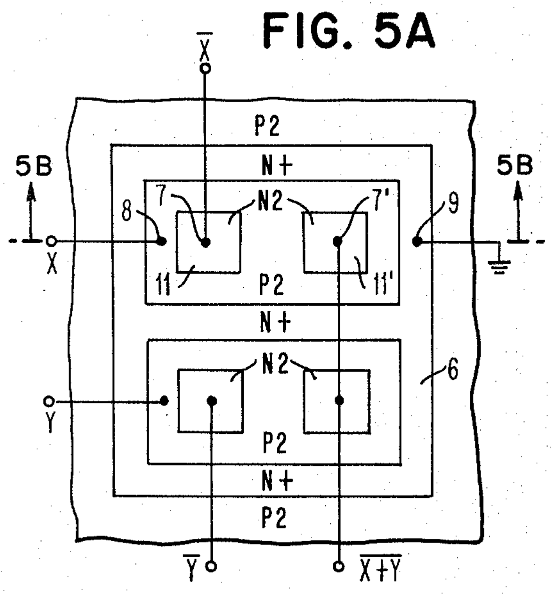
Figure 4:
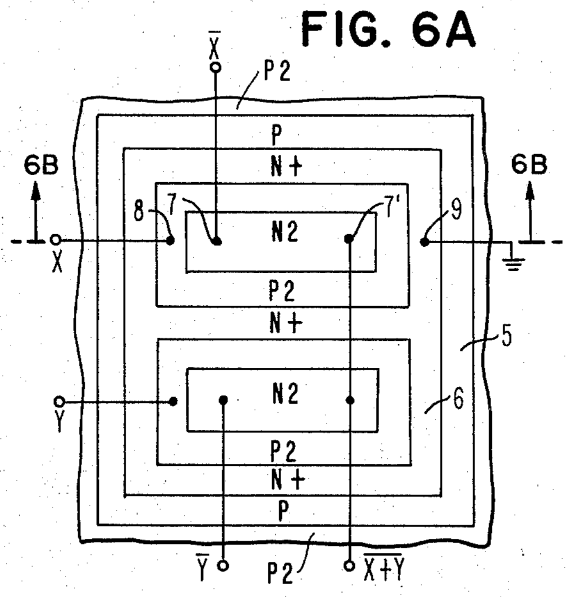

The following is a description of a NOR-circuit realized by means of the semiconductor structure in accordance with the invention. It is known that logical basic networks as well as complex logical networks are realizable by means of NOR circuits. By this token NORing can be regarded as a basic logical operation. If a semiconductor arrangement requiring only a minimum of space could be found for NORing the cost of computers employing a plurality of logical networks, for example, in the arithmetic and logical unit and for address decoding, etc., would be reduced substantially in consequence. By means of the basic circuit described in connection with FIGS. 1 to 3 a NOR-circuit in accordance with the invention is obtained by connecting the outputs of two basic circuits as described. As can be seen from the equivalent-circuit diagram of FIG. 4, such a NOR-circuit permits the implementation of the logical operation $\overline{X+Y}$. In place of a basic circuit with only one transistor T2 a circuit with a further transistor T2' is provided. These two transistors which have common emitters and bases but separate collectors form a multi-collector transistor. In this manner the outputs can be connected via the two collector zones N2', whereas the inverted signal $\overline{X}$ or $\overline{Y}$ of the input signals X or Y to which the base of the two transistors T2, T2' is subjected is applied to the collector zones N2. The output potential with transistor T2' being inhibited is governed by the succeeding stages. Apart from this, the operation of the two basic circuits is identical to that of the basic circuits in accordance with FIGS. 1 to 3. As a function of the inputs signals X and Y current I injected into the common emitters E1 of the transistors T1 either flows to the base of the transistors T2, T2' or is by-passed via the inputs X and Y.

Figure 5B:
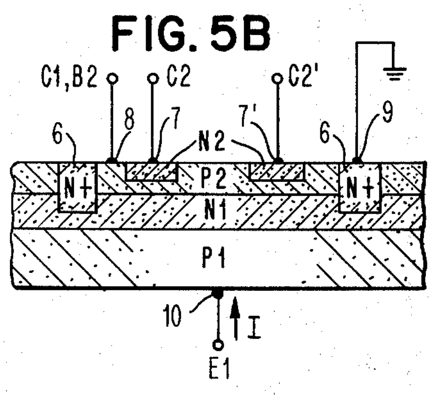
FIG. 5B is a schematic cross-section of the structure of the NOR-circuit in accordance with FIG. 4 and which is realized by means of the basic structure of FIG. 3.
Figure 6B:
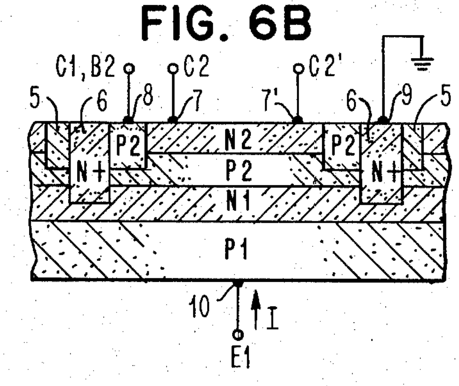
FIG. 6B is a schematic cross-section of the structure of the NOR-circuit in accordance with FIG. 4 and which is realized by means of the basic structure of FIG. 2.

In accordance with the two embodiments of the basic structure in FIGS. 2 and 3, FIGS. 5A, 5B and 6A, 6B show two embodiments of the NOR-circuit. Again, identical reference numbers are used, so that these structures need not be described further. It is pointed out, however, that a multi-collector transistor T2, T2' is used in lieu of transistor T2. This means that in the embodiment of FIGS. 5A and 5B layer P2 comprises two separate collector zones 11 and 11' for forming the collectors C2 and C2'. Thus the embodiment in accordance with FIGS. 5A and 5B corresponds to that of the basic circuit in FIG. 3. For decoupling the two collector outputs C2 and C2' the embodiment in FIGS. 6A and 6B comprises two contacts 7 and 7' on layer N2. These contacts together with layer N2 form Schottky diodes. The structure in FIGS. 6A and 6B essentially corresponds to the embodiment of the basic circuit shown in FIG. 2. FIGS. 5A and 6A are plan views of the topological layout of the NOR-circuit, whereas FIGS. 5B and 6B show a cross-section taken along the cutting line of this structure.

In summary, it can be said that the new structure offers substantial advantages. There is an essential reduction in area on the semiconductor chip. The circuit density is determined mainly by the number and size of the contact holes required for the logical inputs and outputs. Wiring is simple as wiring has to be provided merely for logical combination but not for the current supply. An essential reduction in the input and output capacities of the logical circuits can be obtained by the use of a low-doped layer P2. This leads to an excellent speed/power ratio and a high cutoff speed. The method of production is extremely simple. By means of an N+ doped frame-shaped zone 9 surrounding the structure parasitic lateral injection is prevented, so that cross-coupling is effectively controlled.

It will be understood that the specific embodiments shown in the drawings and described above are merely illustrative of several of the many forms which the invention may take in practice and that numerous modifications and variations of these embodiments will readily occur to those skilled in the art without departing from the scope of the invention which is delineated in the appended claims, and that the claims are to be construed as broadly as permitted by the prior art.

We claim:

1. A monolithic integrated semiconductor structure comprising partial structures, each partial structure including at least one transistor and comprising:
   - a substrate of a first conductivity type,
   - a first layer of an opposed second conductivity type on said substrate,
   - a second layer of said first conductivity type on said first layer,
   - a third layer of said second conductivity type on said second layer,
   - means for contacting the individual layers, said means comprising two frame-shaped zones on said third layer surrounding said partial structure, one of said zones having said second conductivity type and penetrating said third and second layers to reach said first layer, the other of said zones having said first conductivity type and penetrating said third layer to reach said second layer,
   - said one zone being positioned within and passing through said other zone, and
   - transistor biasing electrodes respectively connected to said third layer and to said first and second zones.

2. The structure defined in claim 1 and further including an additional transistor biasing electrode connected to said substrate.

3. The structure defined in claim 2 wherein said first, second and third layers constitute the emitter, base and collector, respectively, of a first transistor and said substrate, first layer and second layer constitute the emitter, base and collector, respectively, of a second transistor.

4. The structure defined in claim 1 wherein said first conductivity type is P-type and said second conductivity type is N-type.

5. The structure defined in claim 1 wherein a plurality of transistor biasing electrodes are connected to said said third layer.

6. The structure defined in claim 5 wherein said third layer constitutes the collectors of a plurality of transistors having commonly connected bases and commonly connected emitters.

* * * * *